Sept. 14, 1954

S. PAKSWER ET AL 2,689,313

PHOTOSENSITIVE CELL

Filed Sept. 1, 1950

SERGE PAKSWER
WILLIAM O. REED
*INVENTORS*

BY Francis W. Crotty
*THEIR ATTORNEY*

Patented Sept. 14, 1954

2,689,313

UNITED STATES PATENT OFFICE 2,689,313

PHOTOSENSITIVE CELL

Serge Pakswer, Elmhurst, and William O. Reed, Chicago, Ill., assignors to Rauland Corporation, a corporation of Illinois Application September 1, 1950, Serial No. 182,778

7 Claims. (Cl. 313—102)

This invention relates to photosensitive cells and more particularly to photosensitive cells of the type employing a photoemissive cathode.

Conventional photo-cells employing photoemissive cathodes comprise spaced electrodes at least one of which is supported from a stem within an hermetically sealed envelope. In the most common form of phototube, the cathode consists of a semi-cylinder of silver or silver-plated copper covered with a composite emitting film, while the anode may conveniently comprise a wire located at the axis of the cylinder. The tube may be evacuated to such an extent that its electrical characteristics are substantially unaffected by gaseous ionization, or a quantity of an inert gas may be introduced into the envelope to increase the sensitivity of the tube, depending on the application for which the photo-cell is intended.

In many applications, the output of the photocell must be amplified to obtain a signal of sufficient magnitude to operate a utilization device. With conventional photo-cells of the type described, noise pickup is usually of such a large magnitude as to detract materially from the overall operation of the circuit, owing to the high internal resistance of the photo-cell. Moreover, since at least one of the tube elements is supported from the stem of the envelope, undesirable distortion due to microphonics may be encountered.

Photo-conductive cells are also known in which the internal resistance may be considerably lower than in a photoemissive cell, and such cells afford the advantage of low noise pickup when used to drive a signal amplifier. However the dynamic response of known types of photo-conductive cells is extremely sluggish.

It is an important object of the present invention to provide a new and improved photosensitive cell which avoids one or more of the disadvantages of the prior art.

It is another object of the invention to provide a photosensitive cell, of the type employing a photoemissive cathode, which is characterized by a low internal impedance, in order to reduce the amount of noise pickup when the cell is used to drive a signal amplifier.

Yet another object of the invention is to provide a new and improved photosensitive cell, of the type employing a photoemissive cathode, which is completely non-microphonic.

A novel photosensitive cell constructed in accordance with the present invention comprises a pair of spaced conductive electrodes having substantial surface areas and a continuum of photoemissive material in electrical contact with a substantial portion of the surface areas of both of the electrodes.

The features of the present invention which are believed to be novel are set forth with particularity in the appended claims. The invention, together with further objects and advantages thereof, may best be understood, however, by reference to the following description taken in connection with the accompanying drawing, in the several figures of which like reference numerals indicate like elements, and in which:

Figures 1, 4:
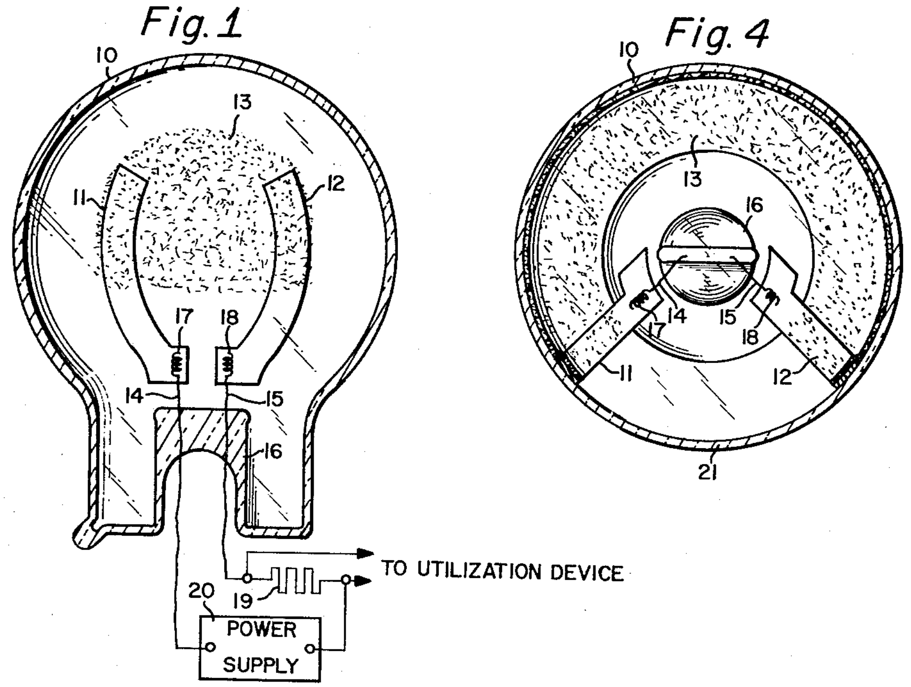
Figure 1 is a sectional view of a novel photosensitive cell constructed in accordance with the present invention together with a schematic representation of an external circuit in which the cell is useful.
Figure 4 is a cross-sectional view, taken in a plane at right angles to the view of Figure 1, of another embodiment of the invention.

In Figure 1, a novel photosensitive cell constructed in accordance with the present invention comprises an hermetically sealed envelope 10, preferably constructed of glass, on the inner wall of which are supported a pair of spaced conductive electrodes 11 and 12. Preferably, electrodes 11 and 12 are constructed of a non-polarizing conductive material such as platinum, for example, and the electrodes may conveniently be formed by painting or otherwise applying conductive strips on the inner wall of the envelope 10 and subsequently baking at an elevated temperature.

A continuum of photoemissive material 13 is provided between electrodes 11 and 12, care being taken to insure that good electrical contact is made between photoemissive continuum 13 and each of the electrodes. Preferably, photoemissive continuum 13 comprises a thin continuous photoemissive cathode film formed on the inner wall of envelope 10 and overlapping electrodes 11 and 12.

In order to provide accessible terminals for electrodes 11 and 12 to facilitate connection of the device in an external circuit, lead-in wires 14 and 15 extend through a stem or press 16 forming a part of the envelope, and connection of lead-in wires 14 and 15 to electrodes 11 and 12 is accomplished by means of a pair of resilient coiled spring members 17 and 18 respectively bearing against the electrodes. Alternatively, the leads may be brought directly out of the glass envelope by known techniques (not shown).

The external circuit for the photo-cell of Figure 1 may comprise simply a load resistor 19 and a power supply 20, which may provide either alternating current or direct current as desired, connected in series between the lead-in conductors 14 and 15, and signal potentials developed across load resistor 19 may be applied to a utilization device (not shown), such as a signal amplifier or the like.

The operation of the device of Figure 1 is dependent upon a newly discovered phenomenon which has been found to exist whenever a photoemissive continuum is placed in electrical contact with both of a pair of spaced conductive electrodes. When a photoemissive film is exposed to light radiation, it is known that photoelectrons are emitted, and it has been conventional practice to provide an anode spaced from the photoemissive cathode to collect the emitted photoelectrons. In accordance with the present invention, it has been found that a skimming effect may also be observed upon exposure of the photoemissive cathode to light radiation. Thus, photoelectrons are found to skim along the surface of photocathode 13 from electrode 11 to electrode 12 or vice versa depending on the polarity of the applied electrostatic field. When the electrodes are connected through a load impedance and a suitable power supply, signal modulation of the incident light is translated as a potential variation across the external load.

The skimming phenomenon described may be observed with all types of photoemissive material present in, for example, alkali or other metal cathodes, alloy cathodes, or composite cathodes of the silver-oxide-alkali metal type. Moreover, the skimming effect may be obtained in either a vacuum photo-cell or a gas-filled photo-cell, so that either type may be used depending on the intended application.

Merely by way of illustration and in no sense by way of limitation, photoemissive layer 13 may be formed by evaporating antimony to a light-transparency of from 30 per cent to 50 per cent, and subsequently flashing caesium onto the antimony film and baking at a temperature of from 170° C. to 200° C. to maximum sensitivity in an atmosphere of surplus caesium vapor. Another composite film which has found widespread use in the photo-cell art is the silver-caesium oxide-caesium film. A film of this type may be formed in accordance with a known process by evaporation or chemical deposit of silver to a light-transparency of from 30 per cent to 50 per cent after which the envelope is filled with oxygen at a pressure of several millimeters of mercury. The surface is then oxidized by a high-voltage gas discharge and the tube is baked at about 100° C. The oxidizing and baking steps are repeated several times, using small amounts of silver to form a coherent oxide surface with the desired resistance, after which caesium is introduced and the tube is baked at about 170° C. to maximum sensitivity. Care must be taken to form only a monatomic layer of caesium. The silver-caesium oxide-caesium cathode affords the advantage, in connection with the present invention, that carbon may be used for the electrode material, while the antimony-caesium cathode requires the use of metallic electrodes to avoid absorption of caesium.

A cell constructed in the manner described may readily be formed with a dark resistance of from 100,000 ohms to 10 megohms, thereby resulting in an improved signal-to-noise ratio as compared with conventional photoemissive cells. The ultimate value of dark resistance is determined by the electrode length and spacing and by the resistivity of the photoemissive cathode. While values of dark resistance below 100,000 ohms may be obtained, as by close spacing of electrodes 11 and 12, it is preferred to keep the dark resistance above this value to avoid deterioration of the photoemissive surface which might be caused by excessive current drain. As in the case of conventional photo-cells, photoemission is limited by tube life considerations to from ten to twenty microamperes per square inch of cathode surface.

In addition to the improved signal-to-noise ratio, a photo-cell constructed in accordance with the present invention furnishes several other advantages over the prior art. Since current may flow in either direction between the electrodes 11 and 12, the phototube may be used with either a direct-current or an alternating-current power supply. Thus, a photoemissive cell utilizing the skimming effect affords the major advantages of photo-conductive cells while providing a dynamic response characteristic comparable with that of a photoemissive cell. Moreover, since there is no opportunity for any of the parts to be subjected to mechanical vibration, the cell is completely non-microphonic. Elimination of the conventional central anode also results in a non-magnetic structure which may be particularly desirable in connection with gyro-compass applications.

Figure 2:
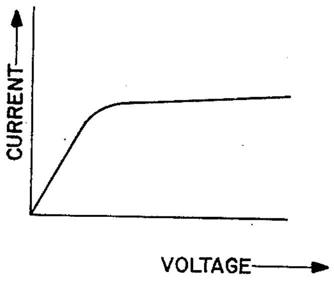
Figures 2 and 3 are graphical representations of operating characteristics of the photo-cell of Figure 1.
Figure 3:
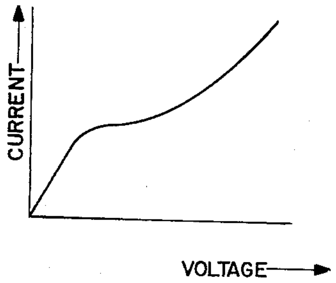

Typical operating characteristics for the photo-cell of Figure 1 are shown graphically in Figures 2 and 3 for some constant illumination. If envelope 10 is evacuated to such an extent that its electrical characteristics are substantially unaffected by gaseous ionization, a characteristic of the type shown in Figure 2 is obtained, with a saturation current of about 40 microamperes per lumen at a power supply voltage of about 20 volts. If argon or neon is introduced at a pressure of about 300 microns of mercury, a characteristic of the type shown in Figure 3 is obtained as in the case of conventional gas-filled photo-cells. The spectral response is determined by the composition of the photoemissive layer 13, and of course by the characteristics of the glass envelope.

In another embodiment of the invention, shown in Figure 4, a larger current capacity may be obtained for a given size envelope by distributing the photoemissive cathode film upon the inner wall of the envelope along a major portion of its circumference. It is to be noted that photocathode 13 may be either semi-transparent or completely translucent or opaque; in any instance, envelope 10 must be provided with at least a light-transmitting portion to which the photocathode is exposed. If the photoemissive film 13 is made translucent or opaque, sufficient photoemission may be obtained in response to incident light arriving through the uncoated portion 21 of the envelope.

Thus, the present invention provides a new and improved photosensitive cell which affords the major advantages of both photoemissive and photo-conductive cells while avoiding many of their disadvantages. The invention is applicable to both high-vacuum and gas-filled phototubes, and the benefits of the invention may be achieved with any of the well-known photoemissive materials. While a cell constructed in accordance with the invention may be advantageously used in any of the conventional photoemissive-cell applications, it is particularly adaptable to apparatus for aligning parts by the passage of a traveling shadow edge across the photoemissive cathode, since the response to small light sources decreases linearly as the illumination is moved from the negative electrode to the positive electrode.

While particular embodiments of the present invention have been shown and described, it is apparent that various changes and modifications may be made, and it is therefore contemplated in the appended claims to cover all such changes and modifications as fall within the true spirit and scope of the invention.

We claim:

1. A photosensitive cell comprising: a pair of spaced conductive electrodes having substantial surface areas; and a continuum of photoemissive material in electrical contact with a substantial portion of said surface areas of both of said electrodes.

2. A photosensitive cell comprising: a pair of spaced conductive electrodes having substantial surface areas; and a continuous photoemissive cathode film in electrical contact with a substantial portion of said surface areas of both of said electrodes and constituting the only path of substantial electrical conductivity between said electrodes.

3. A photosensitive cell comprising: a pair of spaced non-polarizing conductive electrodes having substantial surface areas; and a continuum of photoemissive material in electrical contact with a substantial portion of said surface areas of both of said electrodes and constituting the only path of substantial electrical conductivity between said electrodes.

4. A photosensitive cell comprising: a pair of spaced platinum electrodes having substantial surface areas; and a continuum of photoemissive matereial in electrical contact with a substantial portion of said surface areas of both of said electrodes and constituting the only path of substantial electrical conductivity between said electrodes.

5. A photosensitive cell comprising: an hermetically sealed envelope having a light-transmitting portion; a pair of conductive electrodes having substantial surface areas and supported in spaced relation on the inner wall of said envelope; and a continuum of photoemissive material in electrical contact with a substantial portion of said surface areas of both of said electrodes and at least partially exposed to said light-transmitting portion of said envelope, said continuum of photoemissive material constituting the only path of substantial electrical conductivity between said electrodes.

6. A photosensitive cell comprising: an hermetically sealed envelope having a light-transmitting portion; a pair of conductive electrodes having substantial surface areas and supported in spaced relation on the inner wall of said envelope; and a continuous layer of photoemissive material supported on said inner wall in electrical contact with a substantial portion of said surface areas of both of said electrodes and at least partially exposed to said light-transmitting portion of said envelope, said continuous layer of photoemissive material constituting the only path of substantial electrical conductivity between said electrodes.

7. A photosensitive cell comprising: a light-transmitting hermetically sealed envelope; a pair of conductive electrodes having substantial surface areas and supported in spaced relation on the inner wall of said envelope; and a continuous photoemissive layer of from 30 per cent to 50 per cent light-transparency supported on said inner wall in electrical contact with a substantial portion of said surface areas of both of said electrodes and constituting the only path of substantial electrical conductivity between said electrodes.

References Cited in the file of this patent

UNITED STATES PATENTS

| Number | Name | Date |
|---|---|---|
| 2,096,862 | Spencer | Oct. 26, 1937 |
| 2,163,700 | Ploke et al. | June 27, 1939 |
| 2,185,172 | Bruche et al. | Jan. 2, 1940 |
| 2,448,517 | Cashman | Sept. 7, 1948 |
| 2,544,554 | Holmes | Mar. 6, 1951 |